(12) United States Patent
Kobayashi

(10) Patent No.: US 6,229,095 B1
(45) Date of Patent: May 8, 2001

(54) MULTILAYER WIRING BOARD

(75) Inventor: Naoki Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/408,268

(22) Filed: Sep. 29, 1999

(30) Foreign Application Priority Data

Oct. 1, 1998 (JP) ................................. 10-280088

(51) Int. Cl.[7] ................................. H05K 1/03; H05K 1/36
(52) U.S. Cl. ......................... 174/255; 174/260; 174/262; 174/266; 361/760
(58) Field of Search .................................... 174/255, 266, 174/260, 256, 258, 261, 262; 361/760

(56) References Cited

U.S. PATENT DOCUMENTS

| | | | |
|---|---|---|---|
| 3,932,932 | * | 1/1976 | Goodman ............................... 29/852 |
| 4,464,704 | * | 8/1984 | Huie et al. ............................ 361/792 |
| 4,675,789 | * | 6/1987 | Kuwabara et al. ................... 361/794 |
| 4,685,033 | * | 8/1987 | Inoue ................................... 361/794 |
| 4,710,854 | * | 12/1987 | Yamada et al. ....................... 361/794 |
| 5,010,641 | * | 4/1991 | Sisler ................................... 29/830 |
| 5,027,253 | * | 6/1991 | Lauffer et al. ....................... 361/321 |
| 5,557,844 | * | 9/1996 | Bhatt et al. ........................... 29/852 |
| 5,847,936 | * | 12/1998 | Forehand et al. .................... 361/794 |
| 5,923,540 | * | 7/1999 | Asada et al. ......................... 361/794 |
| 5,966,294 | * | 10/1999 | Harada et al. ........................ 361/794 |

FOREIGN PATENT DOCUMENTS

| | | | |
|---|---|---|---|
| 0 719 079 A1 | * | 6/1996 | (EP) . |
| 52-101263 | | 8/1977 | (JP) . |
| 3-257991 | | 11/1991 | (JP) . |
| 5-102667 | | 4/1993 | (JP) . |
| 9-321433 | | 12/1997 | (JP) . |

* cited by examiner

Primary Examiner—Jeffrey Gaffin
Assistant Examiner—I. B. Patel
(74) Attorney, Agent, or Firm—Sughrue, Mion, Zinn, Macpeak & Seas, PLLC

(57) ABSTRACT

A multilayer wiring board of this invention includes first and second power source patterns of a first potential and a third power source pattern of a second potential. A wiring pattern formed in a signal wiring layer is positioned between the first power source pattern of the first potential and the third power source pattern of the second potential. A hole is connected to the wiring pattern and passes through the first and second power source patterns of the first potential and the third power source pattern of the second potential. A first gap is formed between the first power source pattern of the first potential and the hole. A second gap is formed between the second power source pattern of the first potential and the through hole and is larger than the first gap. Another multilayer wiring board of the present invention includes a top surface, a signal wiring provided on the top surface, a first power source pattern formed in a first power source layer in a position which is the closest to the signal wiring, a second power source pattern formed in a second power source layer and a hole which is connected to the signal wiring and passes through the first and second power source patterns. A first gap is formed between the first power source pattern and the through hole. A second gap is formed between the second power source pattern and the through hole and is larger than the first gap.

16 Claims, 4 Drawing Sheets

MULTILAYER WIRING BOARD

BACKGROUND OF THE INVENTION

The present invention relates to a multilayer wiring board and, more particularly, to a multilayer wiring board in which a through hole passes through a ground layer or a power source layer.

A conventional multilayer wiring board of this type includes a signal wiring layer, a ground layer, and a power source layer. The ground layer and the power source layer supply a predetermined potential to an electronic part mounted on a multilayer wiring board and also set the characteristic impedance of a wiring pattern in the signal wiring layer to a predetermined value. In the portion of the multilayer wiring poard where a through hole passes through without being connected to the ground layer or the power source layer, a capacitive component is generated between the ground layer or the power source layer and the through hole. Reflection noise occurs due to the capacitive component and, as a result, the waveform of a signal transmitted through the through hole is distorted. Consequently, signals having frequencies of 100 mega-hertz (MHz) or higher cannot be transferred.

Also, in order to increase the number of signal wiring patterns in the multilayer wiring board, the number of signal wiring layers is increased. As the number of signal wiring layers increases, the number of the ground layers and the number of power source layers inevitably increase. Consequently, the total capacitance of the capacitive components existing on the signal transmission path and generated between the ground layers or the power source layers and the through hole also increases.

Japanese Patent Application Laid-Open Hei No. 5-102667 discloses a multilayer wiring board which addresses the problem described above. A wiring pattern printed in a signal wiring layer and a through hole are connected via a connecting member having a large inductive component. The connecting member is formed so that it is narrower toward the through hole to increase the inductive component. According to the multilayer wiring board disclosed in the publication, the capacitive reflection noise is cancelled out by inductive reflection noise caused by the connecting member.

However, the multilayer wiring board has reliability problems and is expensive to manufacture. The connecting part where the signal wiring pattern is connected to the through hole breaks easily, thereby decreasing manufacturing yields. This occurs because the signal wiring pattern is narrower toward the through hole to increase the inductive components in the part.

SUMMARY OF THE INVENTION

An object of the invention is to provide a multilayer wiring board in which a number of signal wiring patterns having a small waveform distortion can be formed without reducing reliability.

According to one aspect of the present invention, a multilayer wiring board is provided which includes: first and second power source patterns having a first potential; a third power source pattern having a second potential; a wiring pattern formed in a signal wiring layer positioned between the first power source pattern having the first potential and the third power source pattern having the second potential; a hole which is connected to the wiring pattern and passes through the first and second power source patterns having the first potential and the third power source pattern having the second potential; a first gap formed between the first power source pattern having the first potential and the hole; and a second gap which is formed between the second power source pattern having the first potential and the through hole and is larger than the first gap.

According to another aspect of the present invention, a multilayer wiring board is provided which includes: a top surface; a signal wiring provided on the top surface; a first power source pattern formed in a first power source layer in a position that is closest to the signal wiring; a second power source pattern formed in a second power source layer; a hole which is connected to the signal wiring and passes through the first and second power source patterns; a first gap formed between the first power source pattern and the through hole; and a second gap which is formed between the second power source pattern and the through hole and is larger than the first gap.

According to another aspect of the present invention, a multilayer wiring board is provided which includes: a wiring pattern provided in a signal wiring layer; a first power source pattern in a position that is closest to the wiring pattern; a second power source pattern which is not contiguous to the wiring pattern but is contiguous to the first power source pattern; a hole which is connected to the wiring pattern and passes through the first and second power source patterns; a first gap formed between the first power source pattern and the through hole; and a second gap which is formed between the second power source pattern and the through hole and is larger than the first gap.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

A first embodiment of the present invention will be described in detail below.

Figure 1:
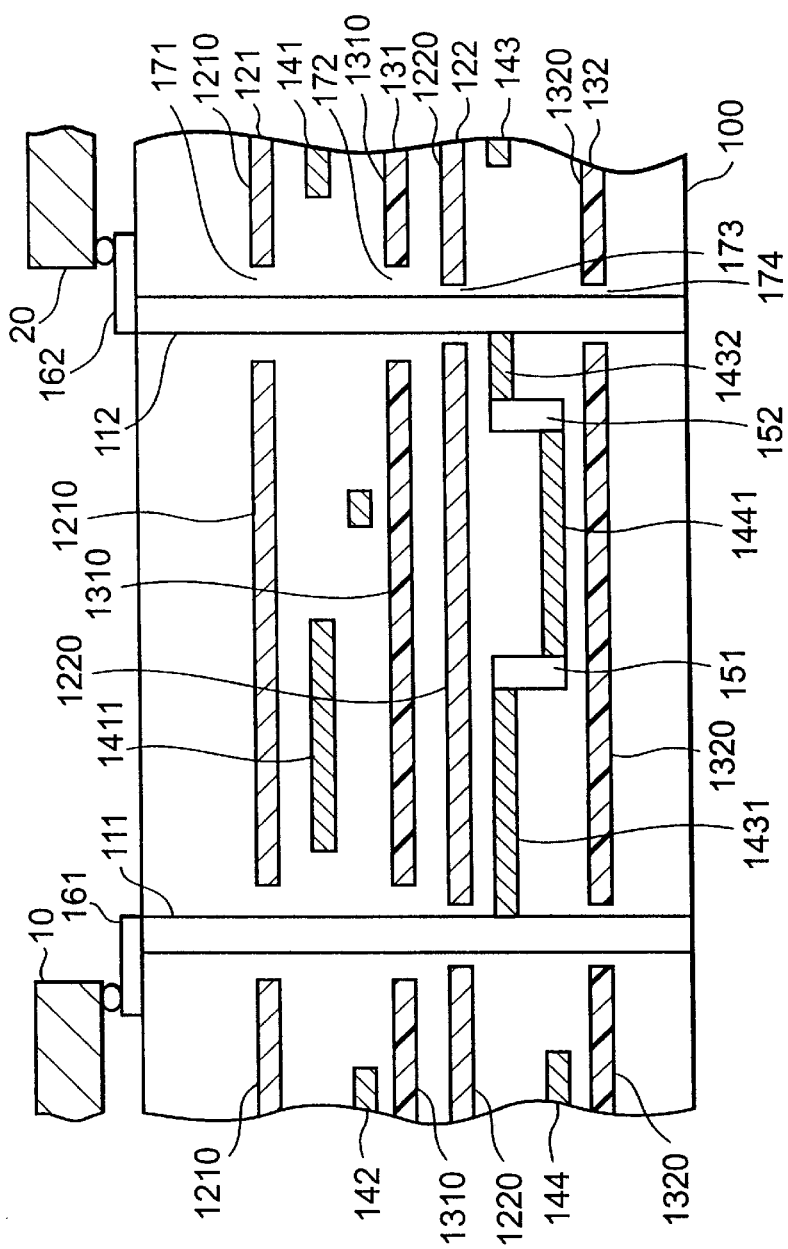
FIG. 1 is a cross section of a first embodiment of the invention.

Referring to FIG. 1, a multilayer printed wiring board 100 includes through holes 111 and 112, ground layers 121 and 122, power source layers 131 and 132, and signal wiring layers 141, 142, 143, and 144. In parts of multilayer wiring board 100 where none of through holes, ground layers, power sources, and signal wiring layers are provided, an insulating layer made of an insulating material is provided. In this embodiment, the insulating material is polyimide. Although multilayer printed wiring board 100 includes other through holes, ground layers, power source layers, and signal wiring layers, they are not shown in FIG. 1.

Through holes 111 and 112 pass through multilayer printed wiring board 100 from the top surface to the bottom surface. In this embodiment, the inner wall of each of through holes 111 and 112 is plated by copper.

Ground layers 121 and 122 are held at the ground potential and supply the ground potential to the signal wiring in multilayer printed wiring board 100. Ground layers 121 and 122 are provided with ground patterns 1210 and 1220, respectively. In this embodiment, ground patterns 1210 and 1220 are comprised of copper.

Power source layers 131 and 132 are held at the power source potential and supply the power source potential to the signal wiring in multilayer printed wiring board 100. In this embodiment, the power source potential is approximately 2.5 volts. Power source layers 131 and 132 are provided with power source patterns 1310 and 1320, respectively. In this embodiment, power source patterns 1310 and 1320 are comprised of copper.

Signal wiring layer 141 is provided between ground layer 121 and power source layer 131. Signal wiring layer 141 includes a wiring pattern 1411. In this embodiment, wiring pattern 1411 is comprised of copper. Wiring pattern 1411 is not connected to either of through holes 111 and 112.

Signal wiring layer 143 is provided between ground layer 122 and power source layer 132. Signal wiring layer 143 includes wiring patterns 1431 and 1432. In this embodiment, wiring patterns 1431 and 1432 are comprised of copper. Wiring pattern 1431 has one end connected to through hole 111 and the other end connected to a via hole 151. Wiring pattern 1432 has one end connected to through hole 112 and the other end connected to a via hole 152.

Signal wiring layer 144 is provided between ground layer 122 and power source layer 132. Signal wiring layer 144 is positioned lower than signal wiring layer 143. Signal wiring layer 144 includes a wiring pattern 1441. In this embodiment, wiring pattern 1441 is comprised of copper. Wiring pattern 1441 has one end connected to via hole 151 and the other end connected to via hole 152.

On the top surface of multilayer printed wiring board 100, integrated circuits (ICs) 10 and 20 are mounted.

On the top surface of the multilayer printed wiring board 100, wiring patterns 161 and 162 are provided. Wiring pattern 161 has one end connected to through hole 111 and the other end connected to an input/output terminal of IC 10. Wiring pattern 162 has one end connected to through hole 112 and the other end connected to an input/output terminal of IC 20. Thus, one of the input/output terminals of IC 10 is connected to through hole 111 via wiring pattern 161 and one of the input/output terminals of IC 20 is connected to through hole 112 via wiring pattern 162.

Wiring patterns 1431 and 1432 are provided between ground layer 122 and power source layer 132 and are connected to through holes 111 and 112, respectively. Ground layer 122 and power source layer 132 therefore, have a role of setting the characteristic impedance of wiring patterns 1431 and 1432 to a desired value.

On the other hand, the wiring patterns provided between ground layer 121 and power source layer 131 are not connected to any of through holes 111 and 112. Thus, ground layer 121 and power source layer 131 do not have a role of setting the characteristic impedance of the wiring patterns connected to through hole 111 or 112 to a predetermined value.

Ground patterns 1210 and 1220 are formed in the entire region of multilayer printed wiring board 100 except for those portion where through holes 111 and 112 pass through. Gaps are formed in ground patterns 1210 and 1220 where through holes 111 and 112 pass through.

A clearance 171 is a gap formed between through hole 112 and ground pattern 1210. Clearance 171 is uniformly formed around the entire periphery of through hole 112. Each of the wiring patterns connected to through hole 112 have a ground pattern located nearer to it than ground pattern 1210. The dimension of clearance 171, the distance between through hole 112 and ground pattern 1210, is therefore set to a length at which a capacitive component is not generated between ground pattern 1210 and through hole 112. In this embodiment, the dimension of clearance 171 is approximately 400 micrometers. The clearance between through hole 111 and ground pattern 1210 is similar to that of clearance 171.

A clearance 173 is a gap formed between through hole 112 and ground pattern 1220. Clearance 173 is uniformly formed around the whole periphery of through hole 112. Clearance 173 is formed between through hole 112 to which wiring pattern 1432 is connected and ground pattern 1220, which is the closest ground pattern to wiring pattern 1432. The dimension of clearance 173, the distance between through hole 112 and ground pattern 1220 is set to a length at which the characteristic impedance of wiring pattern 1432 can be set to a desired value. More preferably, it is set to the shortest possible length that can be manufactured for the following reason. Because ground pattern 1220 is not formed in the position where clearance 173 is provided, if the dimension of clearance 173 is enlarged, the characteristic impedance of the wiring pattern cannot be set to a desired value. In this embodiment, the dimension of clearance 173 is approximately 200 micrometers.

Wiring pattern 1431 is connected to through hole 111 and is the closest wiring pattern to ground pattern 1220. The clearance between through hole 111 and ground pattern 1220 is similar to that of clearance 173.

The power source patterns 1310 and 1320 are formed in the whole region of multilayer printed wiring board 100 except those portions parts where through holes 111 and 112 pass through. Gaps are formed in parts of the power source patterns 1310 and 1320 where through holes 111 and 112 pass through.

A clearance 172 is a gap formed between through hole 112 and power source pattern 1310. Clearance 172 is uniformly formed around the entire periphery of through hole 112. Each of the wiring patterns connected to through hole 112 has a power source pattern located nearer to it than power source pattern 1310. The dimension of clearance 172, the distance between through hole 112 and power source pattern 1310, is therefore set to a length at which the capacitive component is not generated between through hole 112 and power source pattern 1310. In this embodiment, the dimension of clearance 172 is approximately 400 micrometers. A clearance between through hole 111 and power source pattern 1310 is similar to that of clearance 172.

A clearance 174 is a gap formed between through hole 112 and power source pattern 1320. Clearance 174 is uniformly formed around the entire periphery of through hole 112. Clearance 174 is formed between through hole 112, to which wiring pattern 1432 is connected, and power source pattern 1320, which is closest to wiring pattern 1432. The dimension of clearance 174, the distance between through hole 112 and power source pattern 1320, is therefore set to a length at which the characteristic impedance of wiring pattern 1432 can be set to a desired value. More preferably, it is set to the shortest possible length that can be manufactured for the following reason. Because power source pattern 1320 is not formed in the position where clearance 174 is provided, if the dimension of clearance 174 is enlarged, the characteristic impedance of the wiring pattern cannot be set to a desired value. In this embodiment, the dimension of clearance 174 is approximately 200 micrometers.

Because wiring pattern 1431 is connected to through hole 111 and is the closest to power source pattern 1320, the clearance between through hole 111 and power source pattern 1320 is similar to that of clearance 174.

As described above, the characteristic impedance of wiring pattern 1432 is set to a desired value by having ground pattern 1220 separated from through hole 112 only by clearance 173 and power source pattern 1320 separated from through hole 112 only by clearance 174.

The dimension of a clearance, which is set large enough so that the capacitive component is not generated, can be determined in a range where either a ground pattern or a power source pattern, provided with the clearance, can set the characteristic impedance of the wiring pattern, which is close to the ground pattern, or the power source pattern to a desired value.

The goal is setting each clearance is to prevent the capacitive component from being generated, however, it is not necessary to design each clearance so that no capacitive component is generated between the ground pattern or the power source pattern and the through hole. It is sufficient that the total sum of the capacitive components generated between through hole 112 and all of the ground patterns and power source patterns which through hole 112 passes through is suppressed to at or below a predetermined value. The predetermined value is properly determined by the operating frequency of the circuit or the like. For this reason, it is not necessary that clearances 171 and 172 have the same dimension.

Via holes 151 and 152 are used when a signal is transferred between the contiguous signal wiring layers. Because via holes 151 and 152 do not pass through the ground pattern or the power source pattern, the capacitive components generated are smaller than those in the through hole. Consequently, the waveform of a transmitted signal has minimal distortion.

Next, an example in which a single ground pattern or power source pattern is provided with two kinds of clearances will be described.

Figure 2:
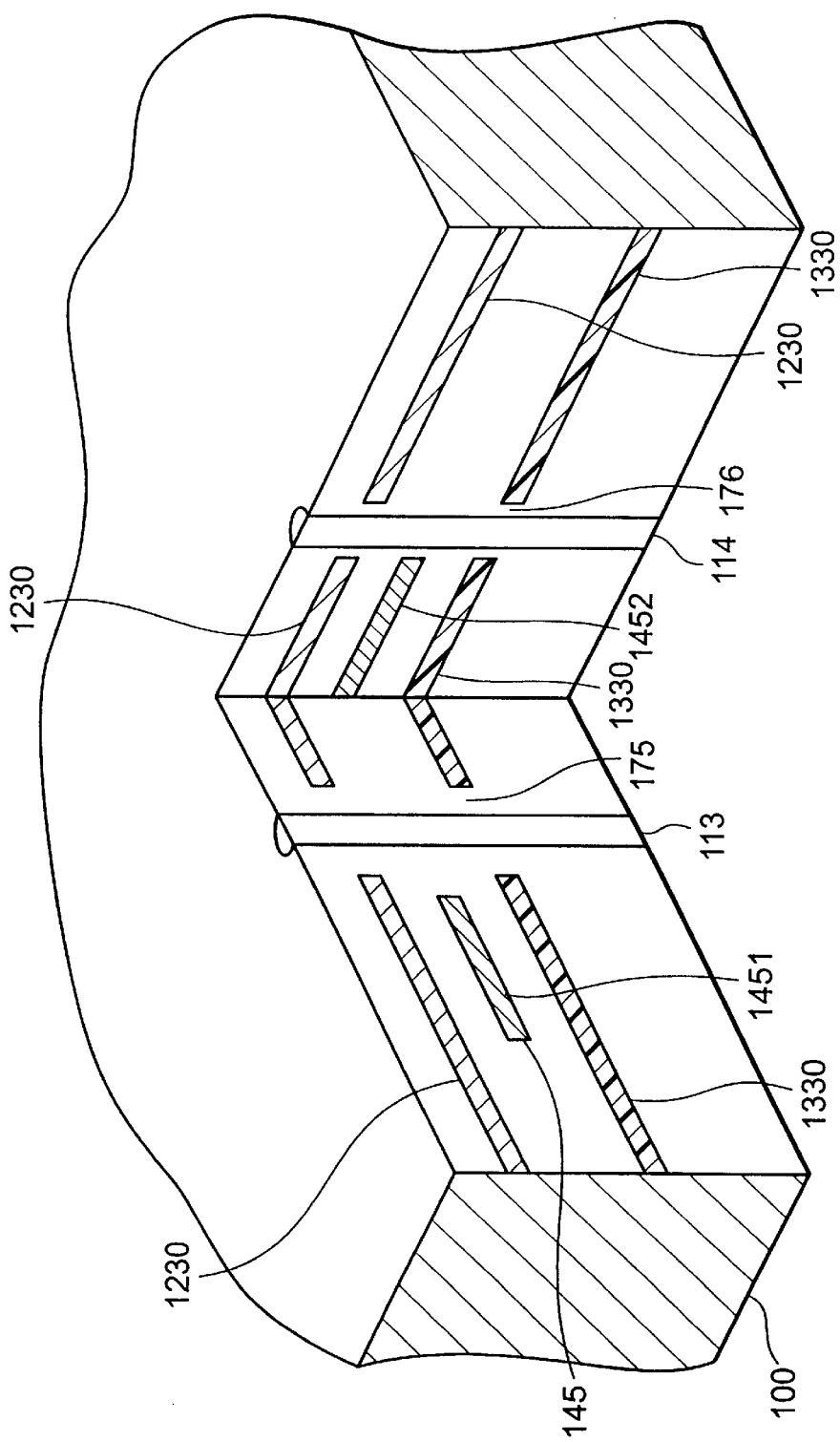
FIG. 2 is an exploded perspective view of the first embodiment of the invention.

Referring to FIG. 2, through holes 113 and 114 pass through a ground pattern 1230 and a power source pattern 1330. A signal wiring layer 145 is provided with wiring patterns 1451 and 1452. Through hole 113 is not connected to either wiring pattern 1451 or 1452. Through hole 114 is connected to wiring pattern 1452.

Power source pattern 1330 includes clearances 175 and 176. Clearance 175 is a gap between power source pattern 1330 and through hole 113. The dimension of clearance 175 is set to a distance at which a capacitive component is not formed between power source pattern 1330 and through hole 113. On the other hand, clearance 176 is a gap between power source pattern 1330 and through hole 114. The dimension of clearance 176 is set to a distance at which the characteristic impedance of wiring pattern 1452 can be set to a desired value.

Next, an operation of this embodiment will now be described in detail.

Referring to FIG. 1, a signal outputted from the output terminal of IC 10 is transmitted via wiring pattern 161 and through hole 111 to wiring pattern 1431 formed in signal wiring layer 143. The signal is transmitted through wiring pattern 1431 and transferred to wiring pattern 1441 in signal wiring layer 144 through via hole 151. The signal transmitted through wiring pattern 1441 is transferred again to signal wiring layer 143 through via hole 152. The signal passes through wiring pattern 1432 and is sent to through hole 112. The signal reaches the input terminal of IC 20 via through hole 112 and wiring pattern 162.

As mentioned above, two kinds of clearances are formed between the through hole and the ground pattern, and between the through hole and the power source pattern. Clearances of the first kind are clearance 173 formed between through hole 112 and ground pattern 1220 and clearance 174 formed between through hole 112 and power source pattern 1320. Clearances 173 and 174 are formed so that the distance between through hole 112 and ground pattern 1220 and the distance between through hole 112 and power source pattern 1320 is of a length necessary to set the characteristic impedance of wiring pattern 1432 connected to through hole 112 to a desired value.

Clearances of the second kind are clearance 171 formed between through hole 112 and ground pattern 1210 and clearance 172 formed between through hole 112 and power source pattern 1310. Regarding clearances 171 and 172, each of the distance between through hole 112 and ground pattern 1210 and the distance between through hole 112 and power source pattern 1310 is set to a length at which the capacitive component is not generated between the through hole and the ground pattern, and between the through hole and power source pattern. The total sum of the capacitive components in through hole 112 can be therefore reduced. As a result, distortion of the waveform of a signal on the signal transmission path, including through hole 112, can be prevented or reduced.

Next, a second embodiment of the present invention will be described in detail. A feature of the second embodiment is that a clearance is formed around a through hole in which a pin of an electronic part is inserted.

Figure 3:
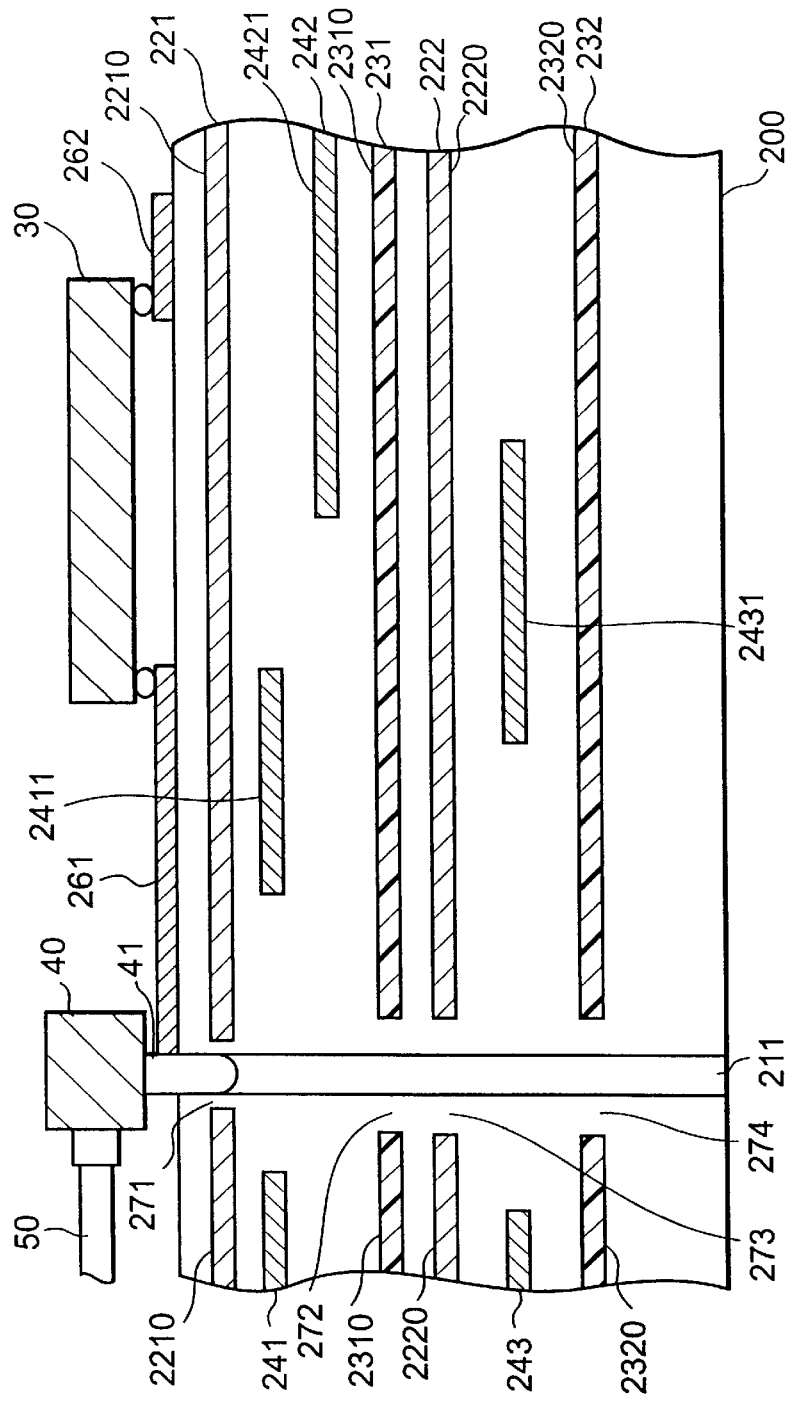
FIG. 3 is a cross section of a second embodiment of the invention.

Referring to FIG. 3, a multilayer printed wiring board 200 includes a through hole 211, ground layers 221 and 222, power source layers 231 and 232, and signal wiring layers 241, 242, and 243. An insulating layer made of an insulating material is formed in a portion of the wiring board where none of the through hole, ground layer, power source layer, and signal wiring layer are provided. Although multilayer printed wiring board 200 includes other through holes, ground layers, power source layers, and signal wiring layers, their description is omitted.

Through hole 211 passes through multilayer printed wiring board 200 from the upper surface to the lower surface. In this embodiment, the inner wall of through hole 211 is plated by copper.

On the top surface of multilayer printed wiring board 200, a connector 40 is mounted. The connector has a pin 41 which is inserted in, and electrically connected to, through hole 211.

Wiring patterns 261 and 262 are provided on the top surface of multilayer printed wiring board 200. Wiring pattern 261 has one end connected to pin 41 of connector 40 and the other end connected to an input/output terminal of an IC 30. Wiring pattern 262 has one end connected to an input/output terminal of IC 30.

Ground layers 221 and 222 are held at the ground potential and supply the ground potential to signal wiring in multilayer printed wiring board 200. Ground layers 221 and 222 are provided with ground patterns 2210 and 2220, respectively. Ground patterns 2210 and 2220 are formed in the entire region of multilayer printed wiring board 200 except for those portions where through hole 221 and other through holes pass through. In this embodiment, ground patterns 2210 and 2220 is are comprised of copper.

Power source layers 231 and 232 are hold at the power source potential and supply the power source potential to the signal wiring in multilayer printed wiring board 200. In this embodiment, the power source potential is approximately 2.5 volts. Power source layers 231 and 232 are provided with power source patterns 2310 and 2320, respectively. Power source patterns 2310 and 2320 are formed in the entire region of multilayer printed wiring board 200, except for those portions where through hole 211 and other through holes pass through. In this embodiment, power source patterns 2310 and 2320 are comprised of copper.

Signal wiring layers 241 and 242 are provided between ground layer 221 and power source layer 231. Signal wiring layer 241 is positioned higher than signal wiring layer 242. Signal wiring layers 241 and 242 include wiring patterns 2411 and 2421, respectively. In this embodiment, wiring patterns 2411 and 2421 are comprised of copper. Neither of wiring patterns 2411 and 2421 are connected to through hole 211.

Signal wiring layer 243 is provided between ground layer 222 and power source layer 232. Signal wiring layer 243 includes a wiring pattern 2431. In this embodiment, wiring pattern 2431 is comprised of copper. Wiring pattern 2431 is not connected to through hole 211.

Ground pattern 2210 is positioned closest to the top surface of multilayer printed wiring board 200 in which wiring pattern 261 connected to through hole 211 is formed and has a role of setting the characteristic impedance of wiring pattern 261 to a desired value. In a portion of the wiring board where through hole 211 passes through in ground pattern 2210, a clearance 271 is formed.

Clearance 271 is a gap formed between through hole 211 and ground pattern 2210. Clearance 271 is uniformly formed around the entire periphery of through hole 211. Clearance 271 is formed between through hole 211, to which wiring pattern 261 is connected, and ground pattern 2210, which is closest to wiring pattern 261. The dimension of clearance 271, the distance between through hole 211 and ground pattern 2210 is set to a length at which the characteristic impedance of wiring pattern 261 can be set to a desired value. Preferably, it is set to the smallest possible length that can be manufactured for the following reason. Because ground pattern 2210 is not formed in the position where clearance 271 is provided, if the clearance is enlarged, the characteristic impedance of wiring pattern 261 cannot be set to a desired value. In this embodiment, the dimension of clearance 271 is approximately 200 micrometers.

Power source pattern 2310, ground pattern 2220, and power source pattern 2320 are not contiguous to the wiring pattern connected to through hole 211. In those portions where through hole 211 passes through power source pattern 2310, ground pattern 2220, and power source pattern 2320, clearances 272, 273, and 274 are formed.

Clearance 272 is a gap formed between through hole 211 and power source pattern 2310. Clearance 272 is uniformly formed around the entire periphery of through hole 211. Each of the wiring patterns connected to through hole 211 has a power source pattern located nearer to it than power source pattern 2310. It is therefore preferable to set the dimension of clearance 272, the distance between through hole 211 and power source pattern 2310, to a length at which no capacitive component is generated between through hole 211 and power source pattern 2310. In this embodiment, the length of clearance 272 is approximately 400 micrometers.

Each of clearance 273 between through hole 211 and ground pattern 2220 and clearance 274 between through hole 211 and power source pattern 2320 is similar to that of clearance 272.

Next, the operation of this embodiment will be described.

In FIG. 3, a signal input through a cable 50 from the outside of multilayer printed wiring board 200 is propagated to pin 41 of connector 40 and transmitted to wiring pattern 261 and through hole 211. The signal transmitted through wiring pattern 261 arrives at the input terminal of IC 30.

As mentioned above, clearance 271 which is formed between through hole 211 and ground pattern 2210 and positioned nearest to wiring pattern 261 on the top surface of multilayer printed wiring board 200, and clearances 272, 273, and 274 whose clearance is formed so that no capacitive component is generated are provided. Clearances 272, 273 and 274 are not formed next to the closest ground pattern or the closest power source pattern to wiring pattern 261. The capacitive components generated around the through hole, in which the pin of the electronic part is inserted for being mounted on the multilayer printed wiring board, can be therefore reduced. As a result, the distortion of the waveform of a signal can be prevented or reduced.

Next, a third embodiment of the present invention will be described in detail. A feature of the third embodiment is that clearances are provided to a through hole used for a signal transfer between signal wiring layers, which cannot be performed by using a via hole.

Figure 4:
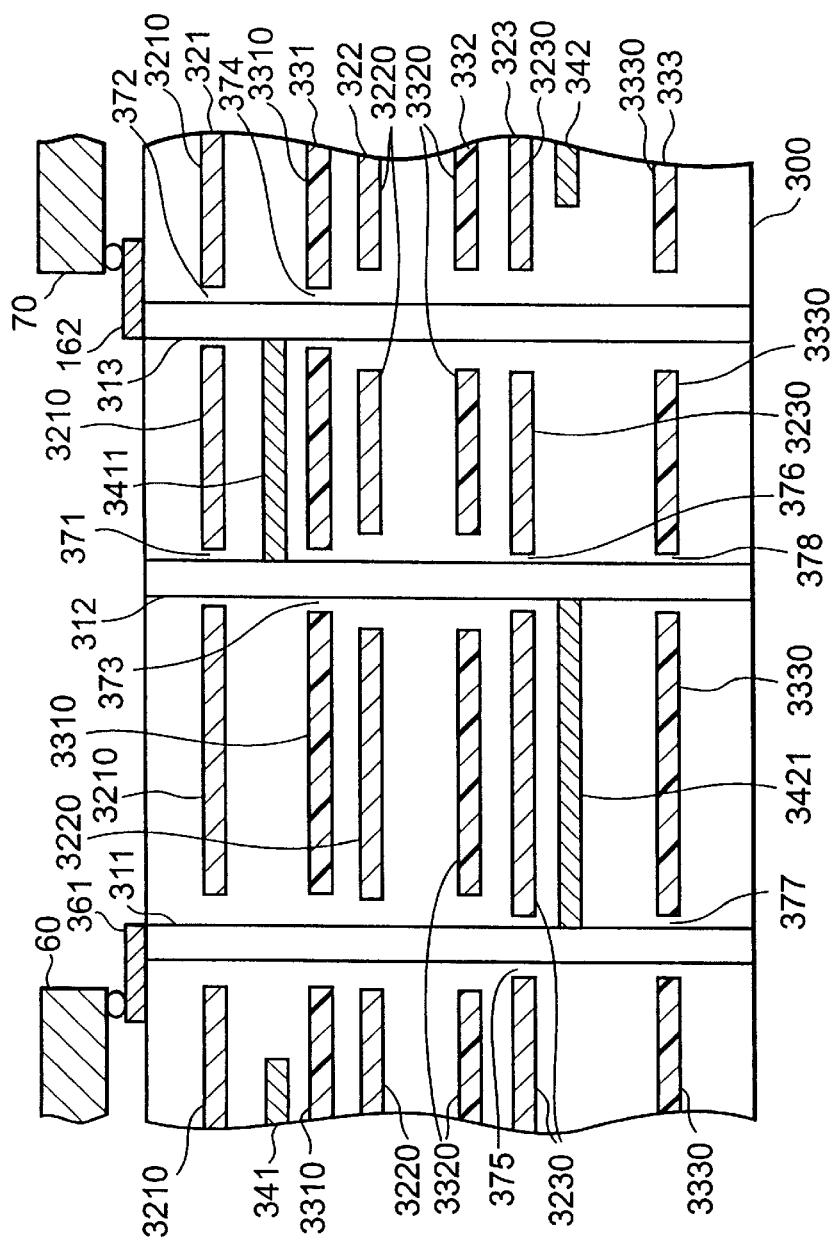
FIG. 4 is a cross section of a third embodiment of the invention.

Referring to FIG. 4, a multilayer printed wiring board 300 includes through holes 311, 312, and 313, ground layers 321, 322, and 323, power source layers 331, 332, and 333, and signal wiring layers 341 and 342. An insulating layer made of an insulating material is formed in those portions where none of the through holes, ground layers, power source layers, and signal wiring layers of multilayer printed wiring board 300 are provided. In this embodiment, the insulating material is polyimide. Although multilayer printed wiring board 300 includes other through holes, ground layers, power source layers, and signal wiring layers, their description is omitted.

Through holes 311, 312, and 313 pass through multilayer printed wiring board 300 from the top surface to the lower surface. In this embodiment, the inner wall of each of through holes 311, 312, and 313 is plated by copper.

Ground layers 321, 322, and 323 are held at the ground potential and supply the ground potential to the signal wiring in multilayer printed wiring board 300. Ground layers 321, 322, and 323 are provided with ground patterns 3210, 3220, and 3230, respectively. In this embodiment, ground patterns 3210, 3220, and 3230 are comprised of copper.

Power source layers 331, 332, and 333 are held at the power source potential and supply the power source potential to the signal wiring in multilayer printed wiring board 300. In this embodiment, the power source potential is approximately 2.5 volts. power source layers 331, 332, and 333 are provided with power source patterns 3310, 3320, and 3330, respectively. In this embodiment, power source patterns 3310, 3320, and 3330 are comprised of copper.

Signal wiring layer 341 is provided between ground layer 321 and power source layer 331. Signal wiring layer 341 includes a wiring pattern 3411. In this embodiment, wiring pattern 3411 is comprised of copper. Wiring pattern 3411 has one end connected to through hole 312 and the other end connected to through hole 313.

Signal wiring layer 342 is provided between ground layer 323 and power source layer 333. Signal wiring layer 342 includes a wiring pattern 3421. In this embodiment, wiring pattern 3421 is comprised of copper. Wiring pattern 3421 has one end connected to through hole 311 and the other end connected to through hole 312.

ICs 60 and 70 are mounted on the top surface of multilayer printed wiring board 300.

Wiring patterns 361 and 362 are provided on the top surface of multilayer printed wiring board 300. Wiring pattern 361 has one end connected to through hole 311 and the other end connected to an input/output terminal of IC 60. Wiring pattern 362 has one end connected to through hole 313 and the other end connected to an input/output terminal of IC 70.

Wiring pattern 3411 provided between ground layer 321 and power source layer 331 is connected to through holes 312 and 313. Ground layer 321 and power source layer 331 have, therefore, a role in setting the characteristic impedance of wiring pattern 3411 to a desired value.

Wiring pattern 3421 provided between ground layer 323 and power source layer 333 is connected to through holes 311 and 312. Ground layer 323 and power source layer 333 have a role in setting the characteristic impedance of wiring pattern 3421 to a desired value.

Ground patterns 3210, 3220, and 3230 are formed in the entire region of multilayer printed wiring board 300, except for the parts where through holes 311, 312, and 313 pass through. Clearances are formed in those portions where through holes 311, 312, and 313 pass through in ground patterns 3210, 3220, and 3230.

A clearance 371 is a gap formed between through hole 312 and ground pattern 3210. Clearance 371 is uniformly formed around the entire periphery of through hole 312. Clearance 371 is formed between through hole 312, to which wiring pattern 3411 is connected, and ground pattern 3210 which is nearest to wiring pattern 3411. The dimension of clearance 371, the distance between through hole 312 and ground pattern 3210, is set to a length at which the characteristic impedance of wiring pattern 3411 can be set to a desired value. It is preferable to set the distance to the shortest possible length that can be manufactured. In this embodiment, the dimension of clearance 371 is approximately 200 micrometers.

Each of clearances 372, 375, and 376 has a formation similar to that of clearance 371.

Power source patterns 3310, 3320, and 3330 are formed in the whole region of multilayer printed wiring board 300 except for those portions where through holes 311, 312, and 313 pass through. Clearances are formed in the parts where through holes 311, 312, and 313 pass through, in power source patterns 3310, 3320, and 3330.

A clearance 373 is a gap formed between through hole 312 and power source pattern 3310. Clearance 373 is uniformly formed around the entire periphery of through hole 312. Clearance 373 is formed between through hole 312, to which wiring pattern 3411 is connected, and power source pattern 3310, which is the closest to wiring pattern 3411. The dimension of clearance 373, the distance between through hole 312 and power source pattern 3310 is therefore set to a length at which the characteristic impedance of wiring pattern 3411 can be set to a desired value. It is more preferable to set the interval to the shortest possible length that can be manufactured. In this embodiment, the dimension of clearance 373 is approximately 200 micrometers.

Each of clearances 374, 377, and 378 is similar to that of clearance 373.

As described above, the characteristic impedance of wiring pattern 3411 is set to a desired value by ground pattern 3210, which is separated from both of through hole 312, only by clearance 371, and through hole 313, only by clearance 372, and power source pattern 3310, which is separated from both of through hole 312, only by clearance 373, and through hole 313, only by clearance 374.

The characteristic impedance of wiring pattern 3421 is set to a desired value by ground pattern 3230, which is separated from both of through hole 311, only by clearance 375, and through hole 312, only by clearance 376, and power source pattern 3330, which is separated from through hole 311, only by clearance 377, and through hole 312, only by clearance 378.

Neither ground pattern 3220, formed in ground layer 322, or power source pattern 3320, formed in power source layer 332, have a role in setting the characteristic impedance of the wiring patterns connected to through holes 311, 312, and 313 to predetermined values. The length of the clearance formed between ground pattern 3220 or power source pattern 3320 and each of through holes 311, 312, and 313 is set to a length at which the capacitive components are not generated between ground pattern 3220 or power source pattern 3320 and each of though holes. In this embodiment, the length of the clearance is approximately 400 micrometers.

Neither ground pattern 3230 formed in ground layer 323 or power source pattern 3330 formed in power source layer 333 have a role in setting the characteristic impedance of the wiring patterns connected to through hole 313 to a predetermined value. The length of each of the clearance formed between ground pattern 3230 and through hole 313 and the clearance formed between power source pattern 3330 and through hole 313 is set to a length at which the capacitive component is not generated between ground pattern 3230 and through hole 313 and between power source pattern 3330 and through hole 313. In this embodiment, the length of the clearance is approximately 400 micrometers.

Next, the operation of this embodiment will be described.

Referring to FIG. 4, a signal outputted from the output terminal of IC 60 is propagated to wiring pattern 3421 formed in signal wiring layer 342 via wiring pattern 361 and through hole 311. The signal passes through wiring pattern 3421 and is transferred to wiring pattern 3411 in signal wiring layer 341 via through hole 312. The signal passed through wiring pattern 3411 is sent to through hole 313. The signal arrives at the input terminal of IC 70 via through hole 313 and wiring pattern 362.

Although polyimide is used as an insulating material of the multilayer printed wiring board in the foregoing embodiments, the invention contemplates the use other materials. For example, ceramics can be used as an insulating material. When using ceramics, wiring is finer than that in the case where polyimide is used. The dimension of the clearance which is small to set the characteristic impedance of the wiring pattern connected to the through hole to a predetermined value can also be made smaller. On the other hand, because ceramics have a dielectric constant larger than that of polyimide, the dimension of the clearance formed to prevent the capacitive component from being generated is larger than that in the case of polyimide.

Although the above clearance are provided around through holes passing through the multilayer printed wiring board from the top surface to the lower surface in the foregoing embodiment, the clearances may be provided around a hole which does not pass through the multilayer printed wiring board. Specifically, it may be possible to provide the clearance around a hole which passes through at least one of the ground pattern and the power source pattern.

As described above, two kinds of clearances are formed between the through hole and the ground pattern and between the through hole and the power source pattern. The clearance of the first kind is a clearance formed between a through hole, to which a wiring pattern is connected, and a ground pattern or a power source pattern which are positioned closest to the wiring pattern. The clearance of the first kind is formed so that a distance between the through hole and the ground pattern or the power source pattern is of a length necessary to set the characteristic impedance of the wiring pattern connected to the through hole to a desired value.

The clearance of the second kind is formed between the through hole and the ground pattern or the power source pattern, each of which is not the closest to the wiring pattern connected to the through hole. The distance between the through hole and the ground pattern or between the through hole and the power source pattern is set to a length at which a capacitive component is not generated between the through hole and the ground pattern or between the through hole and the power source pattern. The two kinds of clearances reduce the total sum of the capacitive components in the through hole. As a result, distortion of the waveform of a signal on a signal transfer path including the through hole can be prevented or reduced.

While this invention has been described in conjunction with the preferred embodiments described above, it will now be possible for those skilled in the art to put this invention into practice in various other manners.

What is claimed is:

1. A multilayer wiring board comprising:
   first and second power source patterns of a first potential;
   a third power source pattern of a second potential;
   a wiring pattern formed in a signal wiring layer positioned between said first power source pattern of said first potential and said third power source pattern of said second potential;
   a hole which is connected to said wiring pattern and passes through said first and second power source patterns of said first potential and said third power source pattern of said second potential;
   a first gap formed between said first power source pattern of said first potential and said hole; and
   a second gap which is formed between said second power source pattern of said first potential and said through hole and is larger than said first gap.

2. The multilayer wiring board as claimed in claim 1, wherein said second gap is formed so that a capacitive component is not generated between said second power source pattern of said first potential and said hole.

3. The multilayer wiring board as claimed in claim 2, wherein said first power source pattern of said first potential and said third power source pattern of said second potential set a characteristic impedance of said wiring pattern.

4. The multilayer wiring board as claimed in claim 1, wherein the distance of said second gap between said second power source pattern of said first potential and said hole is approximately 400 micrometers.

5. The multilayer wiring board as claimed in claim 1, wherein the total sum of the capacitive component generated between said through hole and each of said first and second power source patterns of said first potential and said third power source pattern of said second potential is set to or below a predetermined value.

6. The multilayer wiring board as claimed in claim 1, wherein said hole is a through hole which is provided through said multilayer wiring board.

7. A multilayer wiring board comprising:
   a top surface;
   a signal wiring provided on said top surface;
   a first power source pattern formed in a first power source layer in a position which is the closest to said signal wiring;
   a second power source pattern formed in a second power source layer;
   a hole which is connected to said signal wiring and passes through the first and second power source patterns;
   a first gap formed between said first power source pattern and said through hole; and
   a second gap which is formed between said second power source pattern and said through hole and is larger than said first gap.

8. The multilayer wiring board as claimed in claim 7, wherein said second gap is formed so that a capacitive component is not generated between said second power source pattern and said hole.

9. The multilayer wiring board as claimed in claim 7, wherein the distance of said second gap between said second power source pattern and said hole is approximately 400 micrometers.

10. The multilayer wiring board as claimed in claim 7, wherein the total sum of the capacitive component generated between said first and second power source patterns and said hole is set to or below a predetermined value.

11. The multilayer wiring board as claimed in claim 7, wherein said hole is a through hole which is provided through said multilayer wiring board.

12. A multilayer wiring board comprising:
   a wiring pattern provided in a signal wiring layer;
   a first power source pattern in a position which is the closest to the wiring pattern;
   a second power source pattern which is not contiguous to said wiring pattern but is contiguous to said first power source pattern;
   a hole which is connected to said wiring pattern and passes through said first and second power source patterns;
   a first gap formed between said first power source pattern and said through hole; and
   a second gap which is formed between said second power source pattern and said through hole and is larger than said first gap.

13. The multilayer wiring board as claimed in claim 12, wherein said second gap is formed so that no capacitive component is generated between said second power source pattern and said hole.

14. The multilayer wiring board as claimed in claim 12, wherein the distance of said second gap between said second power source pattern and said hole is approximately 400 micrometers.

15. The multilayer wiring board as claimed in claim 12, wherein the total sum of the capacitive component generated between said first and second power source patterns and said hole is set to or below a predetermined value.

16. The multilayer wiring board as claimed in claim 12, wherein said hole is a through hole which is provided through said multilayer wiring board.

* * * * *